United States Patent
Doris et al.

(10) Patent No.: US 7,018,891 B2
(45) Date of Patent: Mar. 28, 2006

(54) ULTRA-THIN SI CHANNEL CMOS WITH IMPROVED SERIES RESISTANCE

(75) Inventors: Bruce B. Doris, Brewster, NY (US); MeiKei Ieong, Wappingers Falls, NY (US); Thomas S. Kanarsky, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 163 days.

(21) Appl. No.: 10/735,736

(22) Filed: Dec. 16, 2003

(65) Prior Publication Data
US 2005/0127408 A1   Jun. 16, 2005

(51) Int. Cl.
*H01L 21/00* (2006.01)

(52) U.S. Cl. .................. 438/243; 438/300; 438/595
(58) Field of Classification Search ................ 438/199, 438/149, 300, 699, 595, 151, 243
See application file for complete search history.

(56) References Cited

U.S. PATENT DOCUMENTS

| | | | |
|---|---|---|---|
| 6,235,568 B1 * | 5/2001 | Murthy et al. | 438/231 |
| 6,258,659 B1 * | 7/2001 | Gruening et al. | 438/243 |
| 6,660,598 B1 * | 12/2003 | Hanafi et al. | 438/291 |
| 6,677,646 B1 * | 1/2004 | Ieong et al. | 257/347 |
| 6,812,105 B1 * | 11/2004 | Dokumaci et al. | 438/300 |
| 6,841,831 B1 * | 1/2005 | Hanafi et al. | 257/369 |
| 6,906,360 B1 * | 6/2005 | Chen et al. | 257/204 |
| 6,914,303 B1 * | 7/2005 | Doris et al. | 257/350 |
| 6,916,694 B1 * | 7/2005 | Hanafi et al. | 438/166 |
| 2002/0135029 A1 * | 9/2002 | Ping et al. | 257/401 |
| 2003/0162358 A1 * | 8/2003 | Hanafi et al. | 438/291 |
| 2003/0189228 A1 * | 10/2003 | Ieong et al. | 257/347 |
| 2003/0211681 A1 * | 11/2003 | Hanafi et al. | 438/200 |
| 2004/0104433 A1 * | 6/2004 | Ieong et al. | 257/347 |
| 2005/0014314 A1 * | 1/2005 | Dokumaci et al. | 438/151 |
| 2005/0029601 A1 * | 2/2005 | Chen et al. | 257/369 |
| 2005/0045972 A1 * | 3/2005 | Hanafi et al. | 257/412 |
| 2005/0048752 A1 * | 3/2005 | Doris et al. | 438/595 |
| 2005/0051851 A1 * | 3/2005 | Chen et al. | 257/369 |
| 2005/0116289 A1 * | 6/2005 | Boyd et al. | 257/347 |
| 2005/0118826 A1 * | 6/2005 | Boyd et al. | 438/699 |
| 2005/0127408 A1 * | 6/2005 | Doris et al. | 257/288 |
| 2005/0148133 A1 * | 7/2005 | Chen et al. | 438/199 |
| 2005/0164433 A1 * | 7/2005 | Doris et al. | 438/149 |
| 2005/0196926 A1 * | 9/2005 | Hanafi et al. | 438/287 |

\* cited by examiner

*Primary Examiner*—Laura M. Schillinger
(74) *Attorney, Agent, or Firm*—Whitham, Curtis & Christofferson, P.C.; Joseph P. Abate

(57) ABSTRACT

Thin silicon channel SOI devices provide the advantage of sharper sub-threshold slope, high mobility, and better short-channel effect control but exhibit a typical disadvantage of increased series resistance. This high series resistance is avoided by using a raised source-drain (RSD), and expanding the source drain on the pFET transistor in the CMOS pair using selective epitaxial Si growth which is decoupled between nFETs and pFETs. By doing so, the series resistance is improved, the extensions are implanted after RSD formation and thus not exposed to the high thermal budget of the RSD process while the pFET and nFET can achieve independent effective offsets.

8 Claims, 9 Drawing Sheets

ULTRA-THIN SI CHANNEL CMOS WITH IMPROVED SERIES RESISTANCE

BACKGROUND OF THE INVENTION

1. Field of the Invention

The present invention generally relates to the manufacture of transistors for integrated circuits and, more particularly, to the production of complementary pairs of field effect transistors of enhanced performance at extremely small scale.

2. Description of the Prior Art

Performance and economic factors of integrated circuit design and manufacture have caused the scale of elements (e.g. transistors, capacitors and the like) of integrated circuits to be drastically reduced in size and increased in proximity on a chip. That is, increased integration density and proximity of elements reduces the signal propagation path length and reduces signal propagation time and susceptibility to noise and increases possible clock rates while the reduction in element size necessary for increased integration density increases the ratio of functionality which can be provided on a chip to the costs of production (e.g. wafer/chip area and process materials) per chip and, potentially, the cost of devices containing the chips by reducing the number of inter-chip and inter-board connections required.

In response, many improvements in transistor design have been made to maintain suitable levels of performance of these elements, for example, lightly doped drain (LDD) structures (now generally referred to as extension implants since heavier doping levels have been required in current minimum feature size regimes), halo implants and graded impurity profiles have been employed to counteract short channel and punch-through effects and the like, particularly in field effect transistors (FETs) which have become the active device of choice for all but the highest frequency devices. Reduction in device scale has also required operation at reduced voltages to maintain adequate performance without device damage even though operating margins may be reduced.

Thin silicon channel Si devices are becoming a promising option to continue SOI CMOS scaling. It has the advantage of sharper sub-threshold slope, high carrier mobility (because the device is operated at a lower effective field), and better short channel control. Although these attributes are highly desirable, thin silicon channel Si devices have significant disadvantages that could hinder further SOI CMOS scaling. The primary disadvantage is that as the SOI film is thinned, the series resistance increases.

In some prior art thin Si channel devices, the extensions are implanted prior to raised source-drain (RSD) formation. RSD is used to reduce series resistance by increasing the Si thickness outside the channel region. This causes at least two problems. The first problem is that since the pFET extension requires a fairly thick offset spacer, a high resistance region exists under the spacer. The second problem is that since the extension implants are performed prior to the RSD process, the dopants are subjected to the significant thermal budget of the RSD process. This can cause unwanted diffusion of the dopants. In addition, the incubation time (e.g. anneal time) is different for p and n type Si which leads to substantially different RSD thickness for pFET and nFET. Also, the surface concentration of the dopants must be uniform across the wafer as well as from wafer to wafer, which is a major challenge, if the RSD process is to be manufacturable.

In another prior art thin Si channel device, a disposable spacer is used. A wide disposable spacer is used to grow the RSD. Next the deep source and drain implants are done. After this, the spacer is removed, and the extensions are implanted. Although the disposable spacer scheme overcomes the problem of subjecting the extensions to the RSD thermal budget, this process does not overcome the problem of the high-resistance region outside the RSD layer. Accordingly, it is clear that a need exists for a method to overcome the high resistance problem as well as the thermal budget problem.

Typically a trade-off exists between short channel effect control and high current. Specifically, an optimal performance nFET 100 is achieved using a small spacer 121a as shown in FIG. 1g while the optimal pFET 200 has a much larger spacer 221b as shown in FIG. 1h. This is due to the fact that the diffusivity of boron is significantly higher than that of arsenic: the materials used in the pFET 200 and nFET 100 gate areas 122, 222, source and drain regions 128, 228, and extensions 125, 225 respectively. The halo regions 124, 224, however, are boron in the nFET 100 and arsenic in the pFET 200. As shown in FIG. 1g, the boron source and drain regions 228 and extensions 224 of the pFET 200 are diffused greatly during the anneal process thereby creating the short channel effect in the pFET unless a thick spacer is used. The nFET 100 is largely unaffected by the anneal, with the exception of the halo regions 124 diffusing slightly. The nFET 100 performs very well when manufactured using thin offset spacers 121a. FIG. 1h shows how performing the manufacturing process using thick spacers 121b, 221b improves the pFET 200 performance by avoiding the short channel effect, as the source and drain regions 228 are implanted further out from the channel. When annealed, the boron implants 228, 225 diffuse to a beneficial placement. However, the arsenic source and drain regions 128 of the nFET 100 do not adequately diffuse yielding poor performance and a high level of resistance under the thick spacer. Thus, a need exists for an ultra-thin Si MOSFET having a smaller offset for nFET compared to pFET on the same wafer. Such a configuration, however, has not been practical due to the increase of process steps to form spacers of different thicknesses.

SUMMARY OF THE INVENTION

It is therefore an object of the present invention to provide a method for simultaneously achieving CMOS devices on ultra-thin Si channels having improved series resistance, extensions undergoing low thermal budget processing and independent pFET and nFET offset.

It is another object of the invention to provide a method and structure to produce a high performance pFET and nFET device on the same wafer.

It is another object of the invention to allow the silicide to be significantly closer to the channel region thereby increasing the electron mobility and providing lower external resistance.

In order to accomplish these and other objects of the invention, a method of improving the performance of different semiconductor conductivities on the same wafer will be provided comprising steps of fabricating thin spacers on a wafer, forming raised source-drain regions by selective epitaxy, depositing a hard mask film across the wafer, forming a block mask over a first transistor, removing the block film stack from a second transistor, removing said block mask over the first transistor, performing additional selective epitaxial growth affecting only the areas of the second transistor as the block film stack covering the first transistor is resistant to the additional epitaxial procedure, and performing extension implants to the first and/or second transistor.

Additionally, a semiconductor apparatus will be provided comprising a MOSFET device including Si wafer thinning, isolation, gate dielectric, and gate stack patterning, a first transistor, a second transistor, thin sidewall spacers, a thin epitaxial Si layer in the extension region of the first transistor, and a thick epitaxial Si layer in the extension region of the second transistor.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
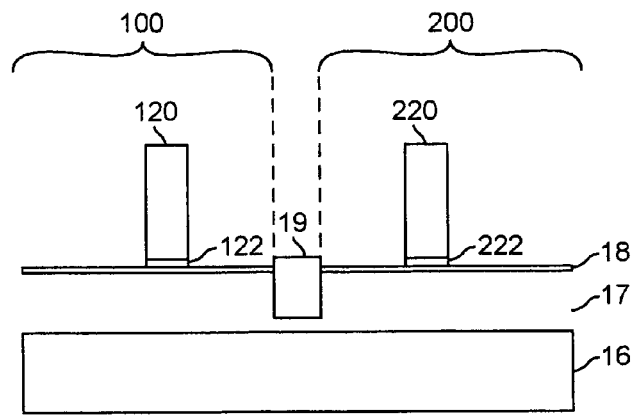
FIGS. 1a–1f show a schematic cross-section of the method and structure of the prior art.
Figure 1B:
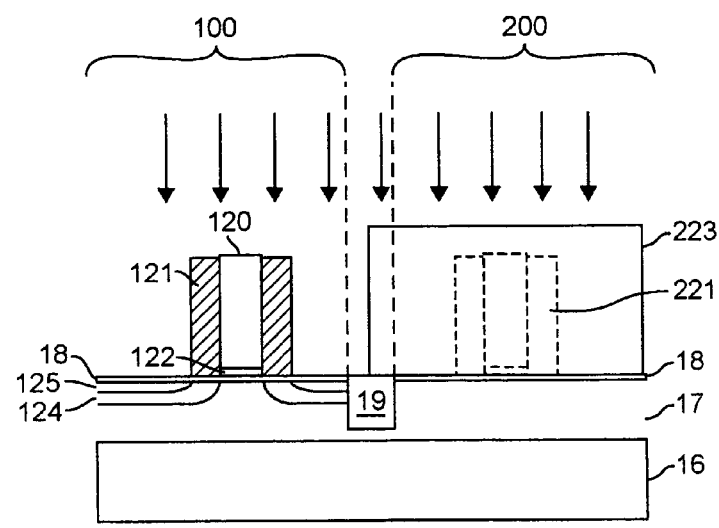
Figure 1C:
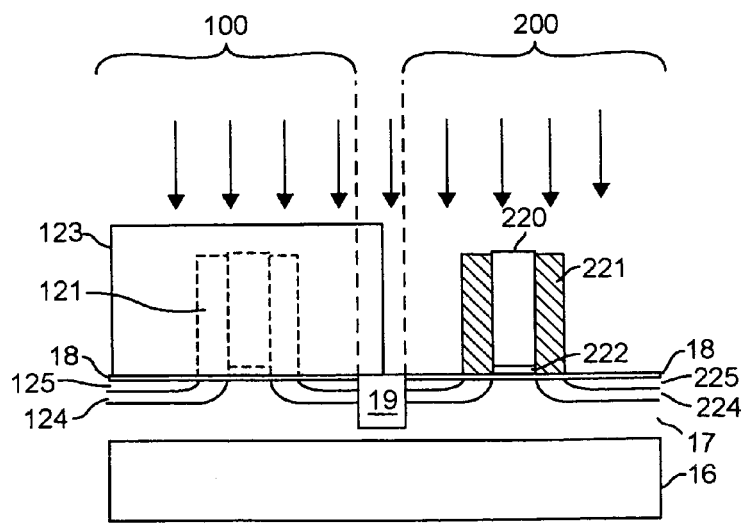
Figure 1D:
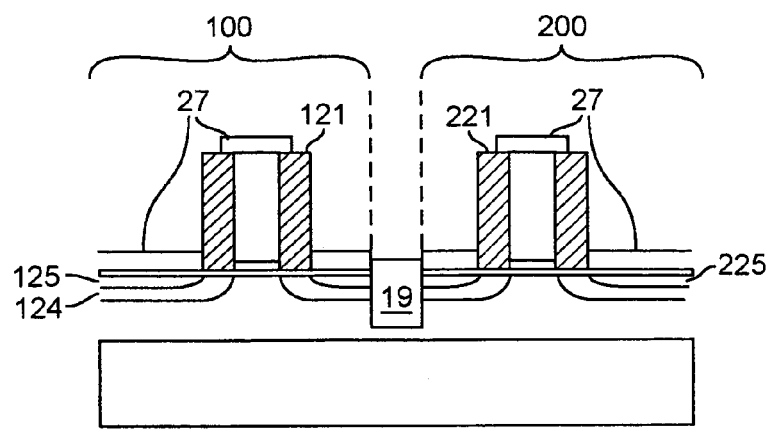

Referring now to the drawings, and more particularly to FIGS. 1a–1f, a method over which the invention provides improvements is shown for forming a CMOS pair. FIGS. 1a–1f are arranged to provide an enhanced understanding of the invention and no portion thereof is admitted to be prior art as to the present invention. The process shown in these steps exhibits particular deficiencies which the present invention successfully avoids. More specifically, FIG. 1a is a cross-sectional view of an SOI device including an Si substrate 16, isolation layer 17, oxide layer 18, gate dielectrics 122, 222, and a patterned gate stacks 120, 220. FIG. 1b illustrates the next step in this process, where spacers 121 are formed in the nFET region 100 and spacers 221 are formed over the pFET region 200. The pFET region 200 is protected using a block out mask 223 while the nFET region 100 has extensions 125 and halos 124 implanted. The mask 223 is removed from the pFET region 200 and another block mask 123 is applied to the nFET region 100 while extensions 225 and halos 224 are implanted within the pFET region 200, as shown in FIG. 1c. After the nFET and pFET extensions 125, 225 are implanted, and a rapid thermal anneal (RTA) process is carried out to remove implant damage thereby reducing transient enhanced diffusion during the raised source and drain (RSD) process. After the anneal, a pre-clean is performed after which the RSD formation is done, and the resulting structure shown in FIG. 1d. Having the extensions 125, 225 implanted prior to the RSD formation can cause at least two problems; (1) the pFET extension 225 requires a fairly thick offset spacer as a high resistance region exists under the spacer, and (2) the dopants used in the extension implants are subjected to the significant thermal budget of the RSD process which can cause unwanted diffusion of the dopants which increases undesirable the short channel effects. The short channel effect may be improved by increasing the spacer thickness. However, this also increases the series resistance for the ultra-thin Si channel device. If the RSD process is to be manufacturable, the surface concentration of the dopants must be uniform across the wafer as well as from wafer to wafer, which becomes a major challenge as excessive RSD thickness can lead to unwanted bridging between isolated Si regions.

Figure 1E:
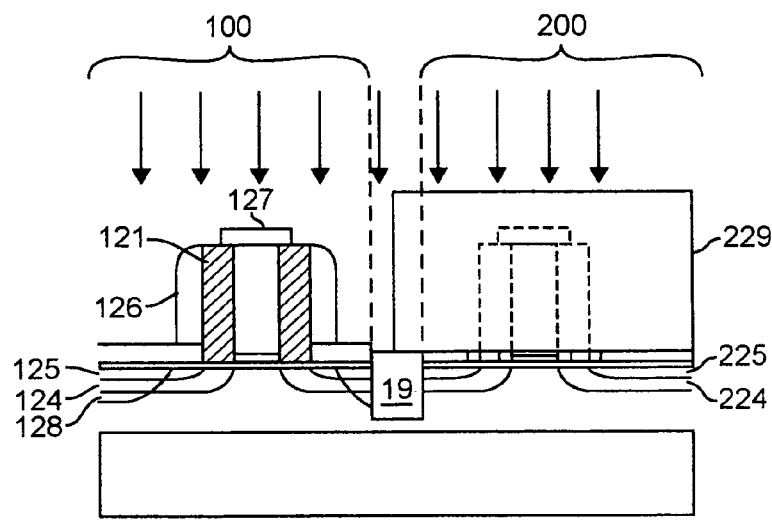
Figure 1F:
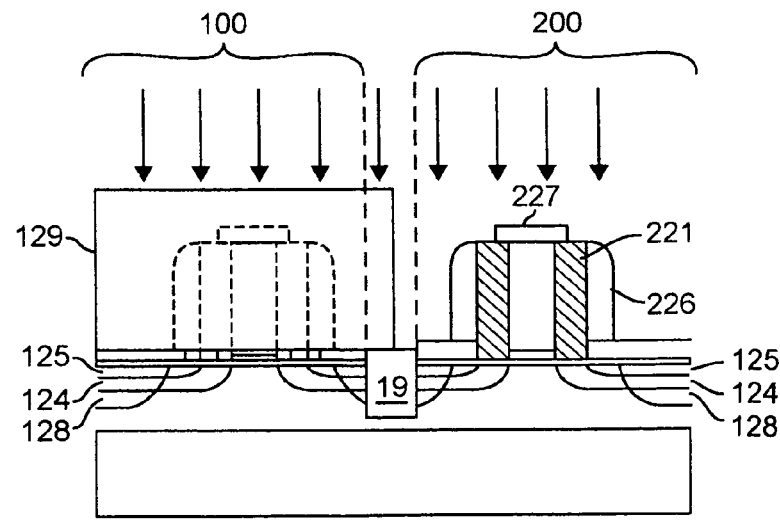
Figure 1G:
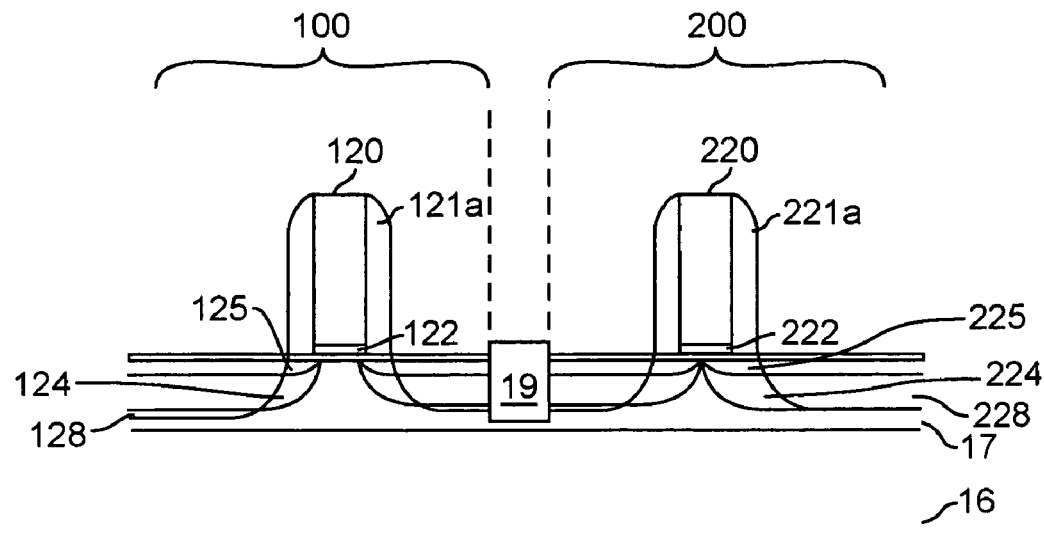
FIG. 1g shows a CMOS transistor pair using a thin offset spacer.
Figure 1H:
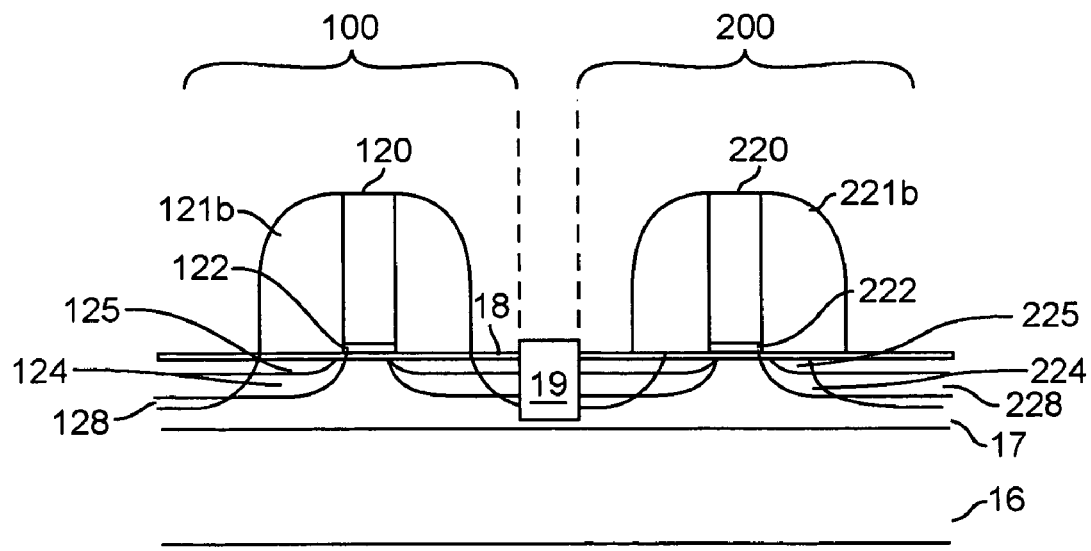
FIG. 1h shows a CMOS transistor pair using thick offset spacers.

Additionally, incubation times differ for p and n type Si which leads to substantially different RSD thickness for the pFET 200 and nFET 100 which can also lead to yield and performance issues. Continuing on to FIG. 1e, illustrating the next step in this process of SOI CMOS formation, large spacers 126, 226 are formed and another block mask 229 is formed over the pFET regions 200 while the nFET source-drain regions 128 are implanted. FIG. 1f shows the block mask 229 removed and another mask 129 applied to the nFET regions 100 as pFET extensions 225 are implanted.

Figure 2:
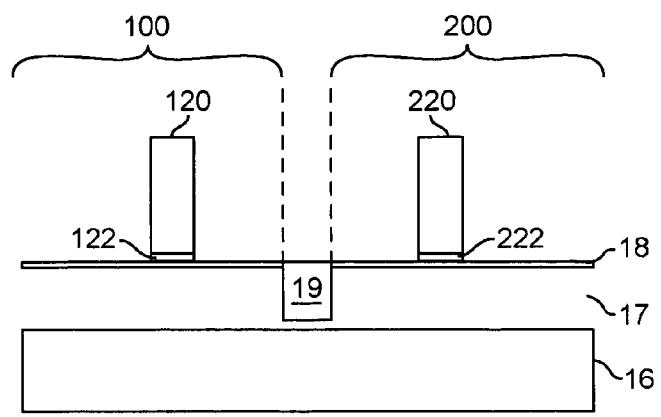
FIG. 2 is a cross-sectional representation of an SOI wafer having undergone device isolation, gate dielectric processing and gate stack patterning using processes well known in the art.

Referring now to FIG. 2, there is shown, in cross-section, an exemplary pair of complementary nMOS 100 and pMOS 200 transistors such as might comprise a CMOS pair in a portion of an integrated circuit. These transistors have been completed through the formation of shallow trench isolation gate oxidation and gate stack patterning and are substantially the same as is shown in FIG. 1a. The method of formation of these transistors and the particulars of their structures are unimportant to an understanding of the invention or its successful practice. It should be understood that while FIG. 2 illustrates transistors prior to the application of the invention thereto, the illustration is intended to be highly schematic for clarity and no portion of FIG. 2 is admitted to be prior art as to the invention.

Figure 3:
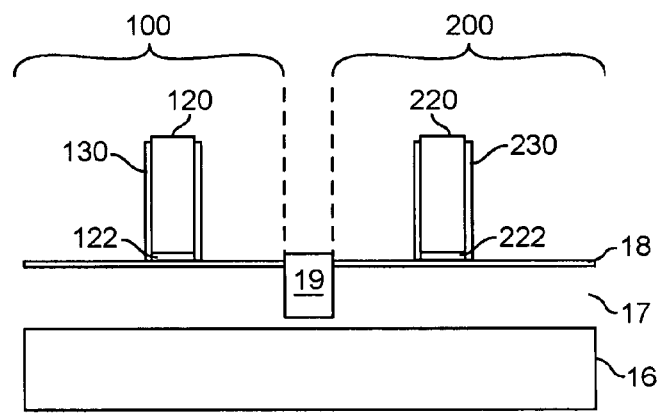
FIG. 3 is a cross-sectional representation of the CMOS pair after thin spacers are formed using standard deposition and spacer etch procedure.

A thin spacer 130, 230 is fabricated using standard deposition and spacer etch procedure, the resulting structure after this step is shown in FIG. 3. A thin SiO2 liner may be deposited prior to a SiN film followed by a SiN spacer etch. The combination of SiO2 and SiN thicknesses should be small, preferably in the range of 3–15 nm since this thickness defines the region of high resistance formed by the thin Si directly outside the channel. This region may be thinner than the channel due to the Si recess caused by the gate stack etch.

Figure 4:
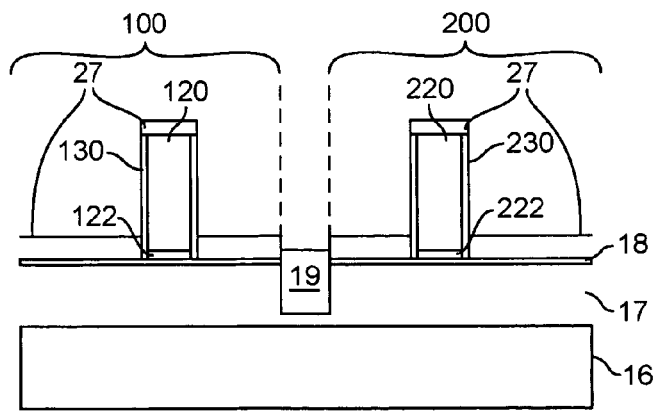
FIG. 4 is a cross-sectional representation of the CMOS pair after RSD is formed by selective epitaxy.

Referring now to FIG. 4, RSD 27 is formed by selective epitaxy. Unlike the RSD process shown in FIG. 1d, the extension implants 125, 225 are not yet present, and therefore are not subjected to the thermal budget of the RSD process. Thus, unwanted diffusion is avoided.

Figure 5:
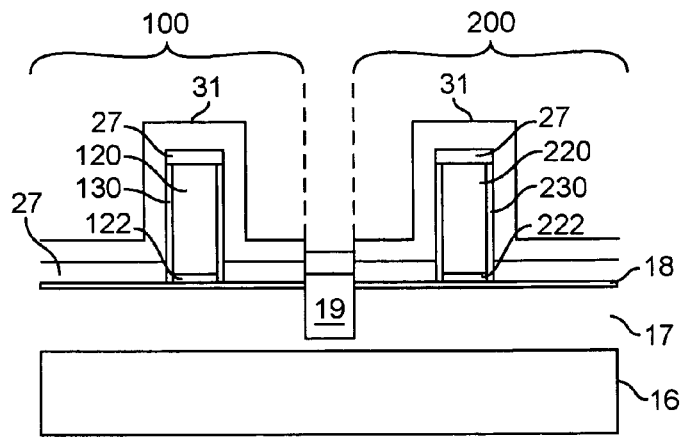
FIG. 5 is a cross-sectional representation of the CMOS pair after a hard mask film is deposited across the entire wafer.
Figure 6:
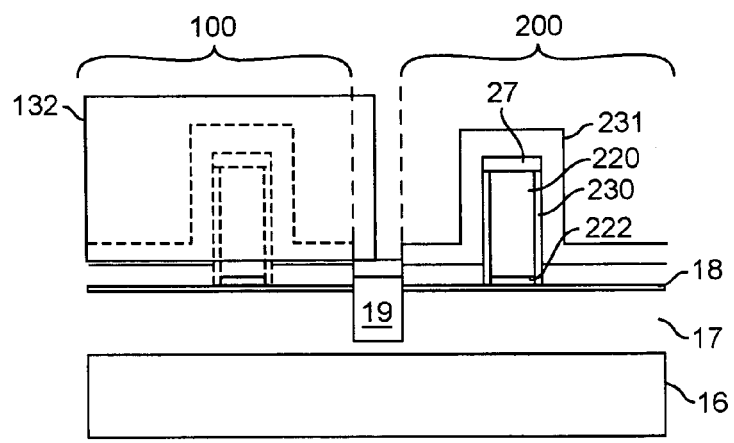
FIG. 6 is a cross-sectional representation of the CMOS pair after a block mask is formed over the nFET regions.
Figure 7:
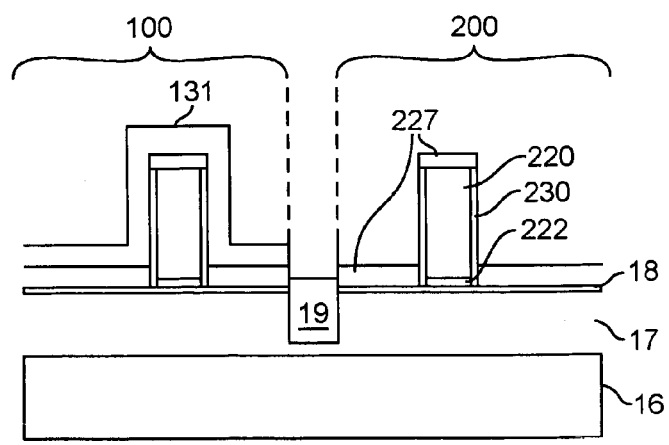
FIG. 7 is a cross-sectional representation of the CMOS pair after the hard mask is removed from the pFET regions and the lithography is removed from the nFET regions.

At this point in the process, a hard mask 31 consisting of SiO2 and possibly SiN is deposited on the entire wafer, as shown in FIG. 5. A block mask 132 is then formed over the nFET regions by conventional lithography as shown in FIG. 6. The block-out mask 132 is used to selectively remove the hard mask 231 from the pFET regions 200 of the wafer. The hard mask 231 may be removed by a dry or wet etching or a combination of dry or wet etching. After the selective film 231 removal and lithography mask 132 removal, the resulting structure is shown in FIG. 7. As shown, the hard mask 131 is still present over the nFET regions 100.

Figure 8:
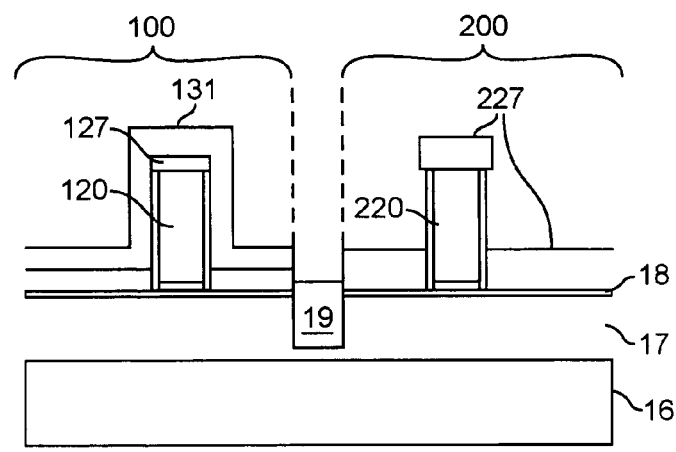
FIG. 8 is a cross-sectional representation of the CMOS pair after a selective epitaxial growth process is carried out.

Referring now to FIG. 8, following a pre-clean which removes any contamination from the pFET region 200, an additional selective epitaxial growth process is carried out. Since the growth process is selective to the hard mask material 131, growth is achieved on the pFET region 200 but not the nFET region 100 of the wafer.

This step is very important to the understanding of the invention. In conventional CMOS devices, optimal performance for an nFET is achieved using a small spacer while the pFET requires a large spacer for optimal performance. This is largely due to the diffusion rate differences exhibited by arsenic and boron, located in the gate areas 120 and 220 of the nFET 100 and pFET 200 respectively, as the diffusivity of boron is significantly higher than that of arsenic. For conventional ultra-thin devices, the smaller spacer can be used to optimize the nFET, however, pFET short channel effect is compromised. If a large offset spacer is used, then the external resistance is high for both devices, resulting in no real overall gain. Further, chip space is consumed and the overall size of a (e.g. complementary) pair of transistors is increased. However, using the method and structure of the current invention, both the nFET and pFET can be optimized simultaneously on the same wafer by the growth process noted above which provides additional thickness for the pFET RSD 227. In doing so, CMOS devices can be made more efficient while maintaining current size, or can maintain an efficiency comparable to current CMOS devices but in a smaller footprint since the source and drain regions need be no larger than is required for a contact.

Figure 9:
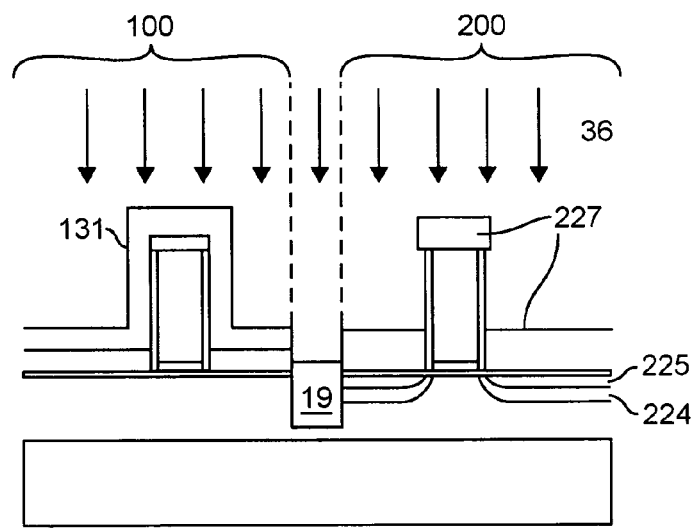
FIG. 9 is a cross-sectional representation of the preferred embodiment of the CMOS pair as extensions are implanted to the pFET region of the Si substrate.

In a preferred embodiment, the hard mask film 131 is suitably thick and the pFET extension implant energy 36 is sufficiently low, then pFET extensions 225 and halos 224 may be implanted as shown in FIG. 9. If the implantation process is done under these conditions, then no additional mask steps are required to achieve this unique device structure. However, additional thickness of hard mask film may be used if desired or needed.

Figure 10:
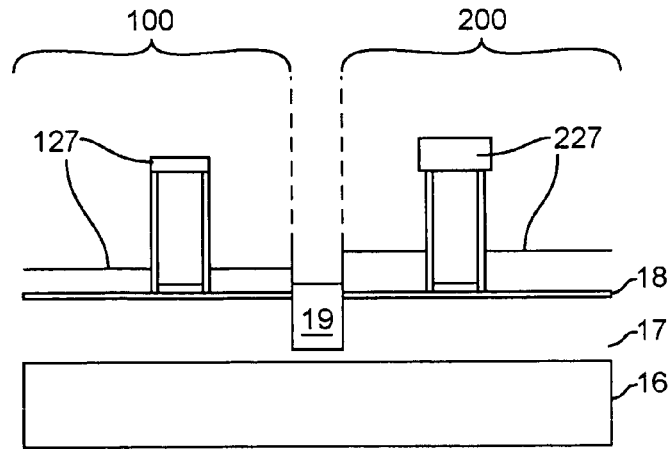
FIG. 10 is a cross-sectional representation of the CMOS pair as the hard mask is removed from the nFET regions following FIG. 8.
Figure 11:
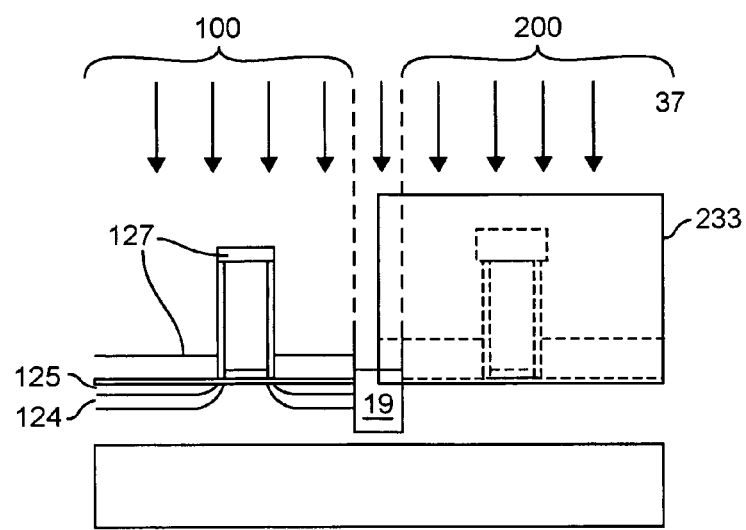
FIG. 11 is a cross-sectional representation of the CMOS pair after a block mask is applied to the pFET regions and nFET extensions are implanted.

In an alternate embodiment, the hard mask film 131 is removed from the nFET regions by an etching procedure, the result shown in FIG. 10. Next a block mask 233 is defined by a conventional lithography procedure for the purpose of protecting the pFET regions 200 from the nFET extension implanting energy 37. The nFET extensions 125 are then implanted as shown in FIG. 11. It is important to note that the RSD thickness may be used to adjust the effective offset of the nFET extension 125 from the gate edge but in the vertical rather than horizontal direction. Additionally, another implant with a different energy and dose may be used to provide optimized contact resistance for silicide.

Figure 12:
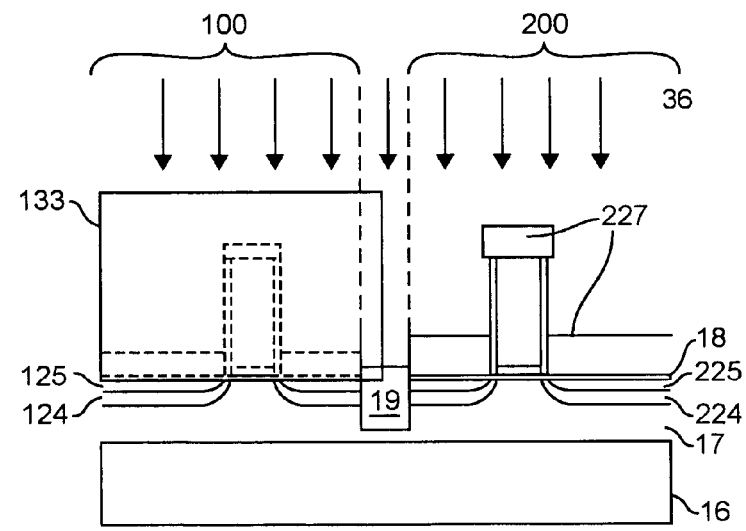
FIG. 12 is a cross-sectional representation of the CMOS pair where the block mask is removed from the pFET regions and another block mask is defined over the nFET regions while pFET extension implants are performed.
Figure 13:
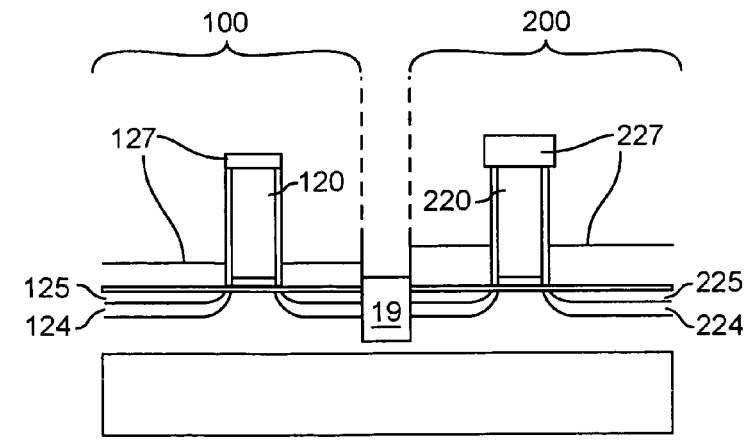
FIG. 13 is a cross-sectional representation of the CMOS pair after the block mask is removed from the nFET region illustrating an alternate embodiment of the device structure.

Next, the block mask 233 is removed from the pFET regions 200 and another block mask 133 is defined over the nFET regions 100. The pFET extension implant is then performed as shown in FIG. 12. The RSD 227 thickness on the pFET regions may be adjusted to provide optimal offset for the pFET extension implant 225. Additionally, another implant with a different energy and dose may be used to provide optimized contact resistance for silicide. Substantial process simplification may be achieved by optimizing the implants, and independently, the RSD thickness for pFET 227 and nFET 127 to provide independent offsets for extension implants 125, 225. The final device structure of this alternate embodiment is shown in FIG. 13.

Figure 14:
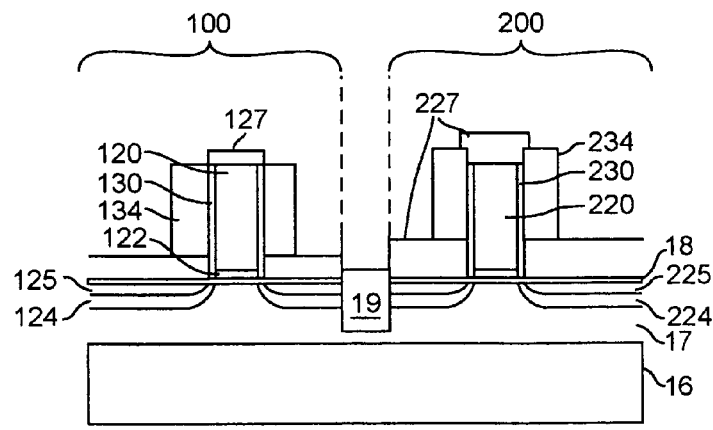
FIG. 14 is a cross-sectional representation of the CMOS pair in another alternate embodiment using optional second spacers to prevent silicide bridging without performing the optional deep source-drain implants.

A perfecting feature of this embodiment is the addition of a deep source-drain spacer 134, 234 as shown in FIG. 14. This second spacer may be used as a silicide spacer to prevent silicide bridging.

Figure 15A:
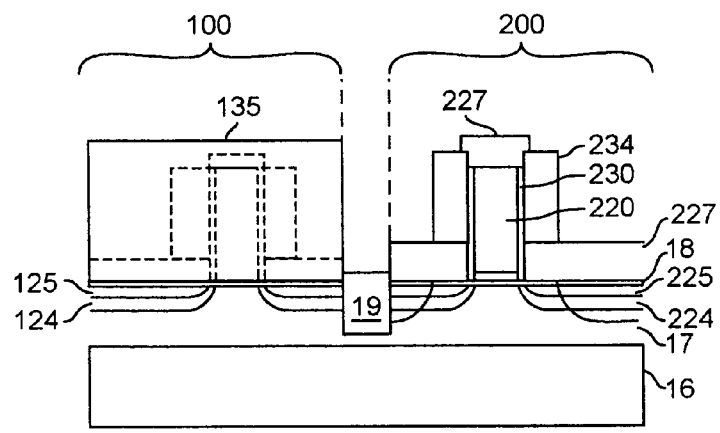
FIGS. 15a, 15b, and 15c are cross-sectional representations of the CMOS pair in another alternate embodiment using optional deep source-drain spacers to form source-drain implants with the final device structure shown in FIG. 15c.
Figure 15B:
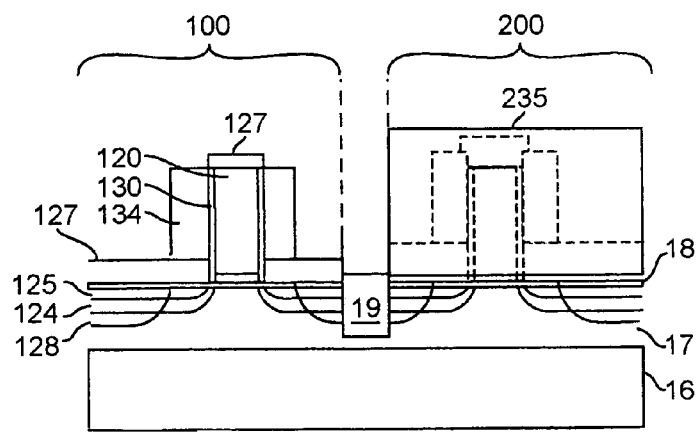
Figure 15C:
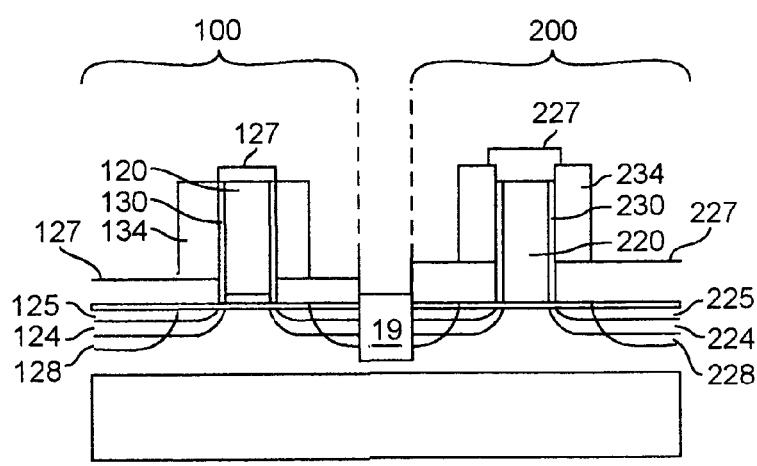

A further perfecting feature uses the deep source-drain spacers 134, 234 to perform source-drain implants 128, 228. More specifically, the nFET regions 100 are covered with a block mask 135 as pFET source-drain implants 228 are formed as shown in FIG. 15a followed by nFET source-drain implants 128 while pFET regions 200 are protected by block mask 235 as shown in FIG. 15b. The resulting structure is shown in FIG. 15c.

In view of the foregoing, a method and structure are provided in order to produce a thin silicon channel SOI CMOS of high performance on a single wafer. In this invention, the silicide can also be closer to the channel region which can increase electron mobility and provide lower external resistance.

While the invention has been described in terms of a single preferred embodiment, those skilled in the art will recognize that the invention can be practiced with modification within the spirit and scope of the disclosed invention.

The invention claimed is:
1. A method of improving the performance of different semiconductor conductivities on the same wafer comprising steps of
    fabricating thin spacers on a wafer adjacent a gate structure,
    depositing a hard mask film across said wafer,
    forming a block mask over a first transistor,
    removing said hard mask film from a second transistor,
    forming a raised source-drain region by selective epitaxy,
    removing said block mask over said first transistor,
    performing additional selective epitaxial growth, effecting only the areas of said second transistor as said hard mask film covering said first transistor is resistant to said additional epitaxial procedure, and
    performing extension implants to RSD regions of at least one of said first or second transistor.

2. A method as recited in claim 1 in which said performance improvements include at least one of
reducing series resistance,
subjecting extensions to low thermal budget processing only,
providing independent offset for said first and second transistors.

3. A method as recited in claim 1 wherein
said first transistor is an nFET, and
said second transistor is a pFET.

4. A method as recited in claim 3 wherein said wafer is an SOI wafer.

5. A method as recited in claim 1 wherein said thin spacers are comprised of
an SiN film followed by a SiN spacer etch,
wherein a thin SiO2 liner may be deposited prior to said SiN film and said SiN spacer etch with the resulting thickness of the spacer ranging from 3–15 nm.

6. A method as recited in claim 5 comprising the further steps of
removing the hard mask from said first transistor,
defining a block mask protecting said second transistor,
implanting extensions to said first transistor,
removing the block mask from said second transistor,
defining a block mask protecting said first transistor, and
implanting extensions to said second transistor.

7. A method as recited in claim 6 further comprising the step of fabricating source-drain spacers.

8. A method as recited in claim 7 further comprising the steps of
applying a first block mask over said second transistor,
performing source-drain implants to said first transistor,
removing said first block mask from said second transistor,
applying a second block mask over said first transistor,
performing source-drain implants to said second transistor, and
removing said second block mask from said first transistor.

* * * * *